United States Patent
Wuidart

(10) Patent No.: US 7,352,606 B2
(45) Date of Patent: Apr. 1, 2008

(54) MONOTONIC COUNTER USING MEMORY CELLS

(75) Inventor: Luc Wuidart, Pourrieres (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/694,165

(22) Filed: Oct. 27, 2003

(65) Prior Publication Data
US 2004/0090839 A1 May 13, 2004

(30) Foreign Application Priority Data
Oct. 28, 2002 (FR) .......................................... 02 13458

(51) Int. Cl.
*G11C 11/00* (2006.01)

(52) U.S. Cl. ....................... 365/148; 365/236
(58) Field of Classification Search ................ 365/148, 365/236
See application file for complete search history.

(56) References Cited

U.S. PATENT DOCUMENTS

| | | | |
|---|---|---|---|
| 4,146,902 A | 3/1979 | Tanimoto et al. | |
| 4,399,372 A | 8/1983 | Tanimoto et al. | |
| 4,559,637 A | 12/1985 | Weber | |
| 4,586,163 A | 4/1986 | Koike | |
| 5,187,559 A | 2/1993 | Isobe et al. | |
| 5,334,880 A * | 8/1994 | Abadeer et al. | ............ 327/526 |
| 5,418,738 A | 5/1995 | Abadeer et al. | |
| 6,433,725 B1 * | 8/2002 | Chen et al. | .................. 341/155 |
| 6,687,325 B1 * | 2/2004 | Wells | .......................... 377/26 |
| 2002/0021269 A1 * | 2/2002 | Rast | .............................. 345/82 |
| 2002/0027793 A1 | 3/2002 | Johnson et al. | |

FOREIGN PATENT DOCUMENTS

DE    101 01 575 A1    7/2002

OTHER PUBLICATIONS

French Search Report from French Patent Application No. 02/13458, filed Oct. 28, 2002.
French Search Report from French Patent Application No. 02/13457, filed Oct. 28, 2002.
French Search Report from French Patent Application No. 02/13694, filed Oct. 31, 2002.
Kato K. et al. "A Physical Mechanism of Current–Induced Resistance Decrease In Heavily Doped Polysilicon Resistors" IEEE Transactions on Electron Devices, IEEE Inc. New York, US, vol. 29, No. 8, Aug. 1982, pp. 1156–1161.

* cited by examiner

*Primary Examiner*—VanThu Nguyen
(74) *Attorney, Agent, or Firm*—Lisa K. Jorgenson; James H. Morris; Wolf, Greenfield & Sacks, P.C.

(57) ABSTRACT

A monotonous counter formed as an integrated circuit, each counting bit being provided by a memory cell containing at least one memorization element formed of a polysilicon resistor, programmable by irreversible decrease in its value.

18 Claims, 4 Drawing Sheets

MONOTONIC COUNTER USING MEMORY CELLS

BACKGROUND OF THE INVENTION

1. Field of the Invention

The present invention relates to the field of counters and, more specifically, to monotonous counters with an irreversible count variation in a single direction.

2. Discussion of the Related Art

Currently, to form monotonous up-counters, fuse elements have to be used, which have the major disadvantage of causing a destructive programming often incompatible with a programming during operation of the integrated circuit containing the fuse element. Another example relates to EPROM or EEPROM memories, the manufacturing of which requires steps not directly compatible with a CMOS technology.

Further, in both cases, the achieved programming state is either erasable (case of EEPROMs) or optically visible, which is prejudicial in security-type applications for which an inviolable count is desired to be available.

An example of application consists of counting the number of events with respect to a limiting event threshold (number of uses of a program or duration of use). In this type of application, it is generally desired to have a counter, each bit of which respectively takes states 0 or 1 in irreversible fashion to provide a binary word representative of the number of events having occurred. For example, the number of accesses to a flash-type memory may be counted. In this application, to have this counting function performed by the actual flash memory, a very large surface area of the memory must be monopolized since the "granularity", that is, the minimum number of cells which must be addressed for an irreversible programming, is significant. In practice, to use as a one-time programming memory a region of a flash memory, a capacity on the order of one kilobit must be reserved to obtain eight one-time programming memory bits.

The other one-time programming memory cell techniques which would be likely to be used in monotonous counting operations are in practice inexploitable. For example, cells of fuse or anti-fuse type require programmings by destructive currents which are often incompatible with the product being manufactured.

SUMMARY OF THE INVENTION

The present invention aims at providing a monotonous counter which overcomes the disadvantages of conventional counters.

The present invention especially aims at providing a solution which does not require monopolizing a large surface area of a flash memory to perform a one-time programming counter function.

The present invention also aims at providing a solution to form a monotonous counter, the counting of which is compatible with the operation of an integrated circuit.

The present invention also aims at providing the forming of a monotonous counter by using conventional MOS-type manufacturing technologies.

To achieve these and other objects, the present invention provides a monotonous counter formed as an integrated circuit, each counting bit being provided by a memory cell containing at least one memorization element formed of a polysilicon resistor, programmable by irreversible decrease in its value.

According to an embodiment of the present invention, the programming of said resistor is performed by temporarily submitting it to a constraint current greater than a current for which its value exhibits a maximum.

According to an embodiment of the present invention, the counter comprises a circuit for decoding the states contained in said cells for providing the resulting count.

According to an embodiment of the present invention, each counting cell comprises, in parallel between two terminals of application of a supply voltage, two branches each comprising:

a first polysilicon programming resistor connected between a first supply terminal and a terminal of differential reading of the cell state; and at least one programming switch connecting one of said read terminals to the second supply terminal.

According to an embodiment of the present invention, each branch comprises a programming switch.

According to an embodiment of the present invention, said programming resistors are two polysilicon resistors identical in size and in possible doping.

According to an embodiment of the present invention, each counting cell comprises a programming transistor in series with a programming resistor.

According to an embodiment of the present invention, the counter further comprises a circuit for controlling the programming of each of the counting cells, capable of providing individual control signals to the programming switches.

The foregoing objects, features, and advantages of the present invention will be discussed in detail in the following non-limiting description of specific embodiments in connection with the accompanying drawings.

DETAILED DESCRIPTION

Figure 1:
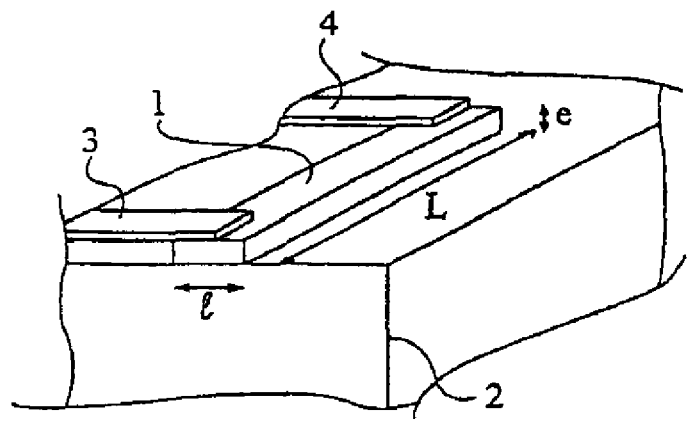
FIG. 1 illustrates, in a partial perspective view, an embodiment of a polysilicon resistor forming the storage element of a counting cell according to the present invention.

Same elements have been designated with same reference numerals in the different drawings. For clarity, only those elements that are necessary to the understanding of the present invention have been shown in the drawings and will be described hereafter. In particular, what exploitation is made of the counting results has not necessarily been detailed, the present invention being implementable whatever the destination of the counting result, provided that an irreversible monotonous counter is desired.

A feature of the present invention is to form a monotonous counter based on as many counting cells as the counter comprises bits. Further, according to the present invention, the memorization element of each counting cell is formed of a polysilicon resistor programmable by irreversible decrease in its value. This feature of the present invention will appear from the following discussion of FIGS. 1 and 2, which illustrates the programming possibilities of a polysilicon resistor exploited by the present invention.

FIG. 1 shows in a very simplified partial perspective view an example of a polysilicon resistor of the type used in a counting cell according to the present invention.

Such a resistor 1 is formed of a polysilicon track (also called a bar) obtained by etching of a layer deposited on an insulating substrate 2. Substrate 2 is indifferently formed of the integrated circuit substrate or is formed of an insulating layer forming an insulating substrate or the like for resistor 1. Resistor 1 is connected, by its two ends, to conductive tracks (for example, metal tracks) 3 and 4 intended to connect the resistive bar to the other integrated circuit elements according to the application. The simplified representation of FIG. 1 makes no reference to the different insulating and conductive layers generally forming the integrated circuit. To simplify, only resistive bar 1 laid on insulating substrate 2 and in contact, by the ends of its upper surface, with the two metal tracks 3 and 4, has been shown. In practice, the connections of resistive element 1 to the other integrated circuit components are obtained by wider polysilicon tracks starting from the ends of bar 1 in the alignment thereof. In other words, resistive element 1 is generally formed by making a section of a polysilicon track narrower than the rest of the track.

Resistance R of element 1 is given by the following formula:

$$R = \rho(L/s),$$

where $\rho$ designates the resistivity of the material (polysilicon, possibly doped) forming the track in which element 1 is etched, where L designates the length of element 1, and where s designates its section, that is, its width l multiplied by its thickness e. Resistivity $\rho$ of element 1 depends, among others, on the possible doping of the polysilicon forming it. In certain cases, the polysilicon element is covered with a metal layer, the resistive element then combining the polysilicon and the overlying metal.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 1, the resistance is thus given by the following relation:

$$R = R_\square * L/l.$$

Quotient L/l corresponds to what is called the number of squares forming resistive element 1. This represents, as seen from above, the number of squares of given dimension depending on the technology, put side by side to form element 1.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

In recent technologies, the use of polysilicon resistors is limited to resistors meant to be run through, in operation, by currents smaller than 100 µA. For greater currents, a diffusion resistor is generally used. Polysilicon is however preferred to a dopant diffusion, since the occurrence of stray capacitances with the substrate is avoided.

To irreversibly decrease the value of a polysilicon resistor, a so-called constraint current is temporarily imposed, for which the resistance switches through a maximum value, this current being beyond the normal operating current range of this resistance. In other words, the resistivity of the polysilicon in the operating current range is decreased, in stable and irreversible fashion, by imposing in the corresponding resistive element the flowing of a current beyond the operating current range.

The current used to decrease the resistance is, conversely to a fusible element, non-destructive for the polysilicon element.

Figure 2:
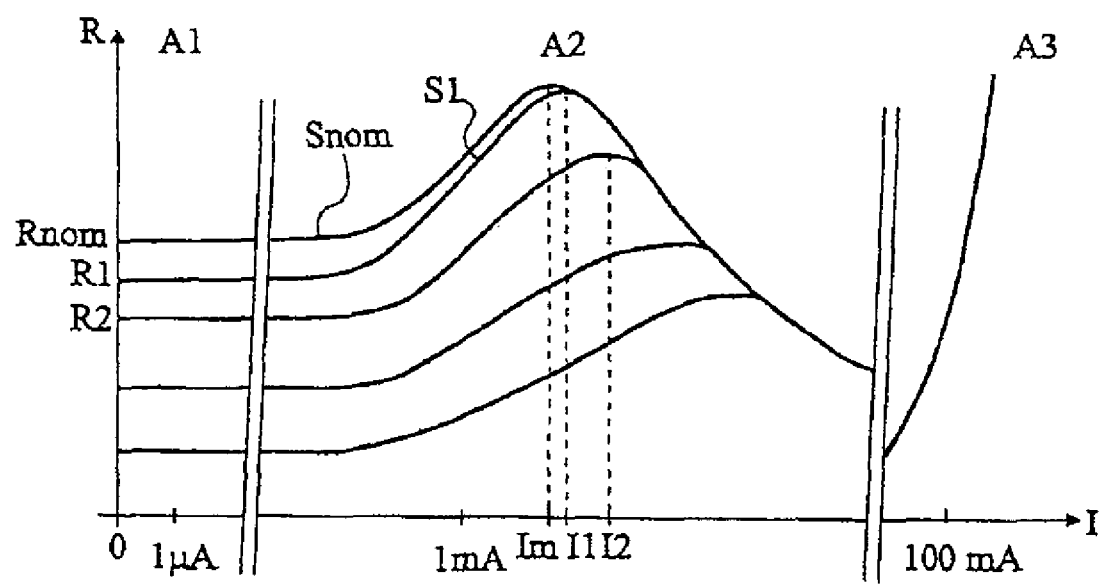
FIG. 2 illustrates, in a curve network, the programming of a cell such as illustrated in FIG. 1.

FIG. 2 illustrates, with a curve network giving the resistance of a polysilicon element of the type shown in FIG. 1 according to the current flowing therethrough, the way of decreasing the resistance of this element.

It is assumed that the polysilicon having been used to manufacture resistive element 1 exhibits a nominal resistivity giving element 1, for the given dimensions l, L, and e, a resistance $R_{nom}$. This nominal (original) value of the resistance corresponds to the value taken in a stable manner by resistive element 1 in the operating current range of the system, that is, generally, for currents smaller than 100 µA.

To decrease the resistance and to switch in an irreversible and stable manner, for example, to a value R1 smaller than $R_{nom}$, a so-called constraint current (for example, I1), greater than a current Im for which the value of resistance R of element 1 is maximum without for all this being infinite, is imposed across resistive element 1. As illustrated in FIG. 2, once current I1 has been applied to resistive element 1, a stable resistance of value R1 is obtained in range A1 of operating currents of the integrated circuit. In fact, curve $S_{nom}$ of the resistance according to the current is stable for relatively low currents (smaller than 100 µA). This curve starts increasing for substantially higher currents on the order of a few milliamperes, or even more (range A2). In this current range, curve $S_{nom}$ crosses a maximum for value Im. The resistance then progressively decreases. In FIG. 2, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the resistance or more specifically the resistivity of the polysilicon element.

Indeed, once the maximum of curve $S_{nom}$ of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal read operating mode (range A1) of the integrated circuit, that is, outside of the normal resistor operation.

Once the value of the polysilicon resistor has been lowered to a lower value (for example, R1 in FIG. 2), an irreversible decrease in this value may further be implemented. It is enough, to achieve this, to exceed maximum current I1 of the new curve S1 of the resistance according to the current. For example, the current value may be increased to reach a value I2. When the current is then decreased again, a value R2 is obtained for the resistor in its normal operating range. The value of R2 is smaller than value R1 and, of course, than value $R_{nom}$.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance ($R_{nom}$, R1, R2) from which the decrease is caused.

What has been expressed hereabove as the resistance value actually corresponds to a decrease in the resistivity of the polysilicon forming the resistive element. The present inventors consider that the crystalline structure of the polysilicon is modified in a stable manner and that, in a way, the material is reflowed, the final crystalline structure obtained depending on the maximum current reached. In fact, the constraint current causes a temperature rise of the silicon element, which causes a flowing thereof.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been made.

The practical forming of a polysilicon resistor according to the present invention does not differ from the forming of a conventional resistor. Starting from an insulating substrate, a polysilicon layer is deposited and etched according to the dimensions desired for the resistor. Since the deposited polysilicon thickness is generally determined by the technology, the two dimensions which can be adjusted are the width and the length. Generally, an insulator is redeposited on the polysilicon bar thus obtained. In the case of an on-line interconnection, width 1 will have been modified with respect to the wider access tracks to be more strongly conductive. In the case of an access to the ends of the bar from the top as shown in FIG. 1, vias will be made in the overlying insulator (not shown) of the polysilicon bar to connect contact metal tracks 3 and 4.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, several methods may be used according to the present invention.

For example, the current is progressively (step by step) increased in the resistor. After each application of a higher current, it is returned to the operating current range and the resistance value is measured. As long as current point Im has not been reached, this resistance value will remain at value $R_{nom}$. As soon as current point Im has been exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it essentially conditions the number of possible decreases. The higher the pitch, the higher the jumps between values will be.

According to another preferred example, the different currents to be applied to pass from the different resistance values to smaller values are predetermined, for example, by measurements. This predetermination takes of course into account the nature of the polysilicon used as well as, preferentially, the square resistance, that is, the resistivity of the material and the thickness with which it is deposited. Indeed, since the curves illustrated by FIG. 2 may also be read as the curves of the square resistance, the calculated values can be transposed to the different resistors of an integrated circuit defined by widths and the lengths of the resistive sections. According to this second embodiment, the value of the constraint current to be applied to the resistive element to decrease its value in an irreversible and stable manner can then be predetermined.

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, any additional duration of application of the constraint current does not modify, at least at the first order, the obtained resistance. Moreover, even if in a specific application, it is considered that the influence of the duration of application of the constraint cannot be neglected, the two methods are perfectly compatible with the taking into account of the duration of application of the constraint.

Figure 3:
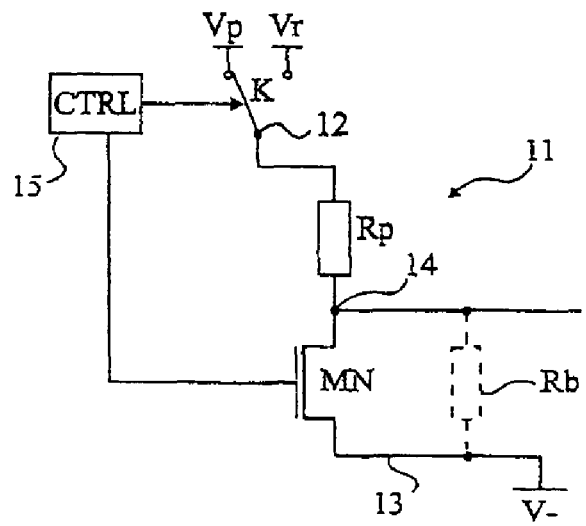
FIG. 3 shows a first embodiment of a counting cell according to the present invention.

FIG. 3 shows a first embodiment of a one-time programming counting cell (or memory cell) according to the present invention.

Cell 11 comprises, in series with a first terminal 12 of application of a positive supply voltage and a second terminal 13 of application of a more negative or reference supply voltage V⁻ (generally, the ground), a resistor Rp programmable by irreversible decrease in its value such as described hereabove in relation with FIGS. 1 and 2, and a programming switch, here, an N-channel MOS transistor (MN). Resistor Rp forms the storage element of cell 11. The state stored in the cell is read from junction point 14 of resistor Rp with transistor MN. The reading of the stored level is performed by comparison with a reference level.

To enable reading of the state stored in cell 11, a resistor Rb (shown in dotted lines in FIG. 3) is provided, which, when transistor MN is off, forms with resistor Rp a voltage-dividing bridge. Resistor Rb has been shown in dotted lines to illustrate its optionality. Indeed, it may be formed by transistor MN then biased in a linear portion of its characteristic and not in saturation.

Transistor MN, when on, short-circuits (at least functionally) fixed resistor Rb and is used to program resistor Rp by imposing the flowing of a current therethrough. The programming current of resistor Rp is greater than the current for which this resistance exhibits a maximum value determined as described previously in relation with FIGS. 1 and 2.

The nominal range of the operating currents of a polysilicon resistor used according to the present invention is smaller than some hundred microamperes and, most often, smaller than some ten microamperes. The amplitude of the programming currents is on the order of one milliampere.

The programming of a cell such as illustrated in FIG. 3 is made possible by providing selection of the positive supply voltage applied to terminal 12 between a read voltage Vr (adapted to generating a current on the order of one microampere) and a programming voltage Vp (adapted to generating a current on the order of one milliampere). The selection is performed by means of a switch K controlled by a control circuit 15 (CTRL) further providing the control signal adapted to transistor MN.

The counting operation consists of causing the irreversible decrease of the value of resistor Rp by applying a constraint current thereto. In read mode, the comparison of the voltage of a cathode with respect to a reference value enables determining whether the counting cell contains a state 0 or a state 1.

Figure 4:
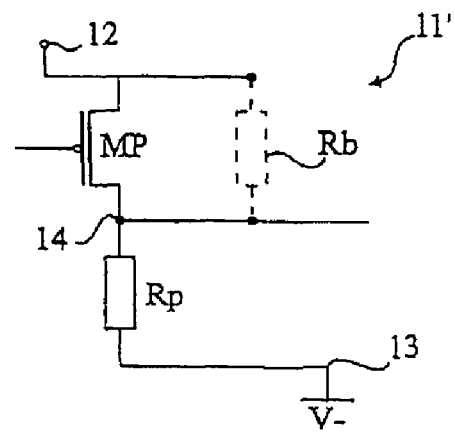
FIG. 4 shows a second embodiment of a counting cell according to the present invention.

FIG. 4 shows a second embodiment of a counting cell 11' according to the present invention. This cell differs from the cell of FIG. 3 by the fact that the programming transistor MP used is a P-channel MOS transistor. Transistor MP is connected between terminal 12 and read point 14. Programming resistor Rp is connected between point 14 and terminal 13 of application of the reference voltage. In FIG. 4, switch K and control circuit 15 although still present, have not been shown. Resistor Rb in dotted lines has been symbolized in parallel on transistor MP.

The operation of a cell 11' such as shown in FIG. 4 is similar to that of cell 11 of FIG. 3. The latter however forms a preferred embodiment due to the lesser bulk of the N-channel MOS transistor with respect to the P-channel MOS transistor.

Figure 5:
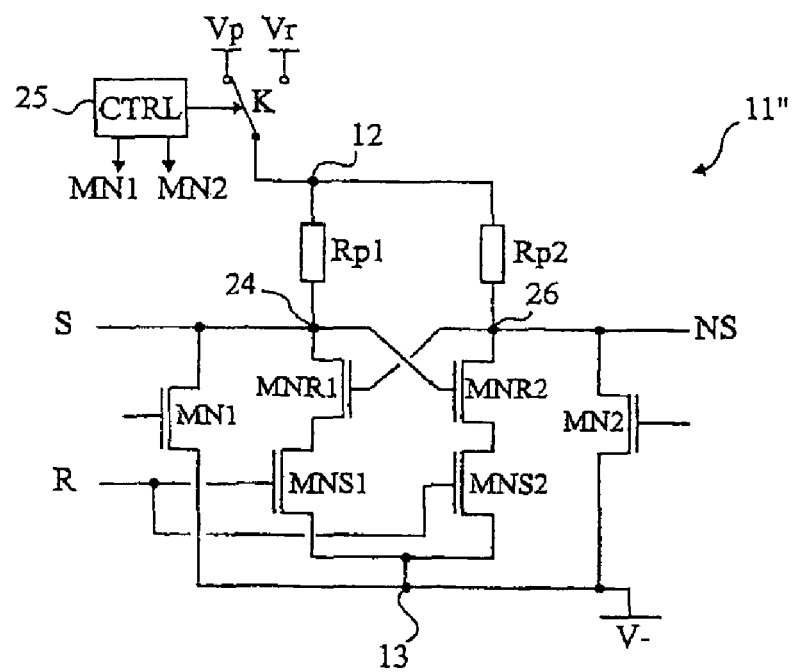
FIG. 5 shows a third embodiment of a counting cell according to the present invention.

FIG. 5 shows a third embodiment of a cell 11" of irreversible counting according to the present invention. The essential difference with respect to the counting cells shown in FIGS. 3 and 4 is that the structure of FIG. 5 is a differential structure which does not use a reference voltage to perform the comparison enabling detecting the state stored in the cell.

Cell 11" of FIG. 5 comprises two resistive branches in parallel between two supply terminals 12 and 13, two programming transistors MN1 and MN2 (in this example, N-channel MOS transistors), a control circuit 25 (CTRL), and a selector K between two supply voltages, respectively of reading Vr and programming Vp. The programming of a cell such as illustrated in FIG. 5 occurs similarly to that of the cells of FIGS. 3 and 4. What here changes is the cell structure enabling the reading.

In the embodiment of FIG. 5, a first so-called left-hand branch in the orientation of the drawing comprises in series, a first resistor Rp1, a read MOS transistor MNR1, and a selection MOS transistor MNS1. The interconnection between resistor Rp1 and transistor MNR1 forms a first output terminal S arbitrarily called the direct output terminal (non-inverted). Terminal S also corresponds to point 24 of connection of resistor Rp1 to programming transistor MN1. A second so-called right-hand branch in the orientation of the drawing comprises, in series, a second resistor Rp2, a read MOS transistor MNR2 and a selection MOS transistor MNS2. The interconnection between resistor Rp2 and transistor MNR2 (and thus the drain of this transistor) forms a second inverse output terminal NS with respect to terminal S. Output NS also corresponds to point 26 of connection of resistor Rp2 to programming transistor MN2. The gate of transistor MNR2 is connected to terminal 24 while the gate of transistor MNR1 is connected to terminal 26 to obtain the effect of a bistable. The gates of transistors MNS1 and MNS2 are connected together to a terminal R intended to receive a read selection signal of the counting cell. This signal preferably corresponds to the counting cell selection signal in a unidirectional arrangement of several cells. It is then provided by the adapted column or line decoder. In the example shown, all transistors have N channels.

The read operation of a cell according to this embodiment is the following. Circuit 25 causes the switching of selector K to voltage Vr. Preferably, this is its quiescent state since the other state is only used in programming (and thus, in principle, only once per cell). Input terminal R receives the cell selection (or read configuration) signal (active in the high state), turning on the two transistors MNS1 and MNS2.

As a result, one of the MNS terminals sees its voltage increase faster than the other. This imbalance comes from the value difference between resistors Rp1 and Rp2. It causes the conduction of one of transistors MNR1 and MNR2. Due to the crossing of the gates of this transistor, that which conducts first is that having a gate taking part in the electric path (from terminal 12) having the shortest time constant (the resistor having the smallest value generates a shorter time constant), and thus that having a drain voltage increasing slower than the other. Once on, this MNR transistor forces its drain (and thus the corresponding output terminal S or NS) to ground 13, which confirms the off state of the MNR transistor of the other branch, and thus the high state on the corresponding output terminal.

The programming of a cell according to the embodiment is performed in the same way as for the first two embodiments, by means of one of transistors MN1 and MN2. However, transistors MNS1 and MNS2 of the counting cell must be off upon programming (input R low). They are used to protect read transistors MNR1 and MNR2 by making their sources float, thus avoiding the occurrence of destructive gate-source voltages due to supply voltage Vp. Further, by disconnecting the MNR transistors by their sources, the MNS transistors prevent them from seeing, between their drain and source, high voltage Vp. Accordingly, the MNR and MNS transistors can be sized according to read voltage Vr. Only programming transistors MN need sizing to hold voltage Vp and stand the relatively high current (as compared to the read operating range) used to program the cell.

Like for the embodiment of FIG. 3, that of FIG. 5 also applies to P-channel MOS transistors. The transposing of the embodiment of FIG. 5 to P-channel MOS transistors is within the abilities of those skilled in the art.

According to an alternative embodiment, it is possible to use a single supply voltage for the counting cell. The selection of the supply voltage between levels Vp and Vr is thus avoided. In this case, a sufficient supply voltage to impose the desired constraint to the programming of resistors Rp1 and Rp2 (FIG. 5), or of resistors Rp (FIGS. 3 and 4) is chosen. The transistor dimensions are then chosen accordingly.

Figure 6:
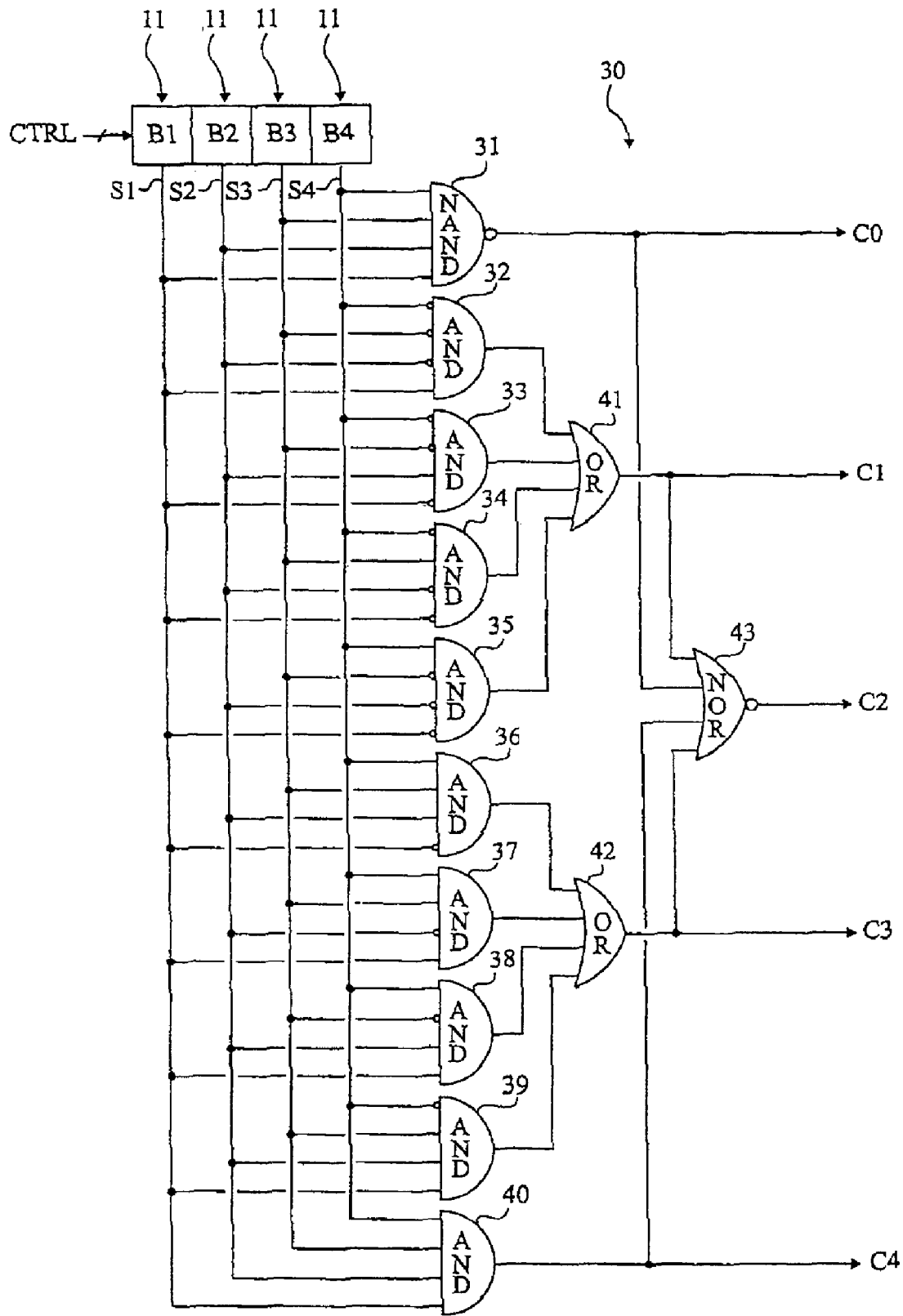
FIG. 6 shows an embodiment of a decoding circuit of a four-bit counter according to the present invention.

FIG. 6 shows an embodiment of a counter over four bits associated with its decoding circuit.

The four bits B1, B2, B3, and B4 of the counter are individually provided by a cell 11 (or 11', or 11"), the storage element of which is formed of at least one polysilicon resistor such as described hereabove. In FIG. 6, neither the counting cell structure, nor the different programming and selection control signals CTRL have been detailed. In the example of FIG. 6, it can be assumed that the four bits are arranged in a line of cells 11 which are all simultaneously read to each provide, on its respective S1 to S4, value 0 or 1 of the bit stored in the cell.

The number of cells at state 0 and at state 1 is detected by a decoding circuit 30. Circuit 30 may be formed in different manners according to the exploitation made of the counting results. FIG. 6 illustrates a practical example to show the feasibility of such a circuit.

In this example, the four respective outputs of the counting cells are connected to the respective inputs of ten logic gates with four inputs among which there is one NAND-type gate 31 and nine AND-type gates 32 to 40. Gate 31 directly receives the states of outputs S1 to S4, and gate 40 directly receives the states of outputs S1 to S4. Gates 32 to 35 receive three of outputs S1 to S4 in inverted fashion and the remaining output directly, the rank of the direct output changing for each gate. Gates 36 to 39 receive three of outputs S1 to S4 directly and the last output in inverted fashion, the rank of the inverted output changing at each of gates 36 to 39.

Output C0 of gate 31 indicates, by a high state, the fact that all cells 11 store a low state, and thus a zero count.

The output of gates 32 to 35 are combined by a four-input OR-type gate 41, the output of which provides a count C1 indicative that a single one of the counting cells is at state 1.

The outputs of gates 36 to 39 are connected to four respective inputs of an OR-type gate 42, the output of which provides a count C3 indicative that three of the four cells are at state 1.

The output of gate 40 directly provides a count C4 indicative of a state 1 of the four cells.

The respective outputs of gates 31, 41, 42, and 40 are combined by a NOR-type gate 43, the output of which provides a count C2 indicative that two of the cells are at state 1.

It can be seen from above decoding circuit 30 that with four counting cells with a polysilicon resistor, five counting states can be obtained (from 0 to 4). For each additional counting cell 11, one count unit is added.

An advantage of the present invention is that it enables forming a perfectly reliable monotonous counter, the programming of which does not go along with a destruction of the counting cells.

Another advantage of the present invention is that the count stored in the counting cell assembly is invisible, in that it is not optically detectable as would be the case for a counter formed from fuse cells. This advantage and the irreversible character of the counter are particularly advantageous in security applications.

The example of FIG. 6 shows the case of an increasing monotonous counter. It should however be noted that, according to the decoding circuit used, a decreasing count can be obtained.

Figure 7:
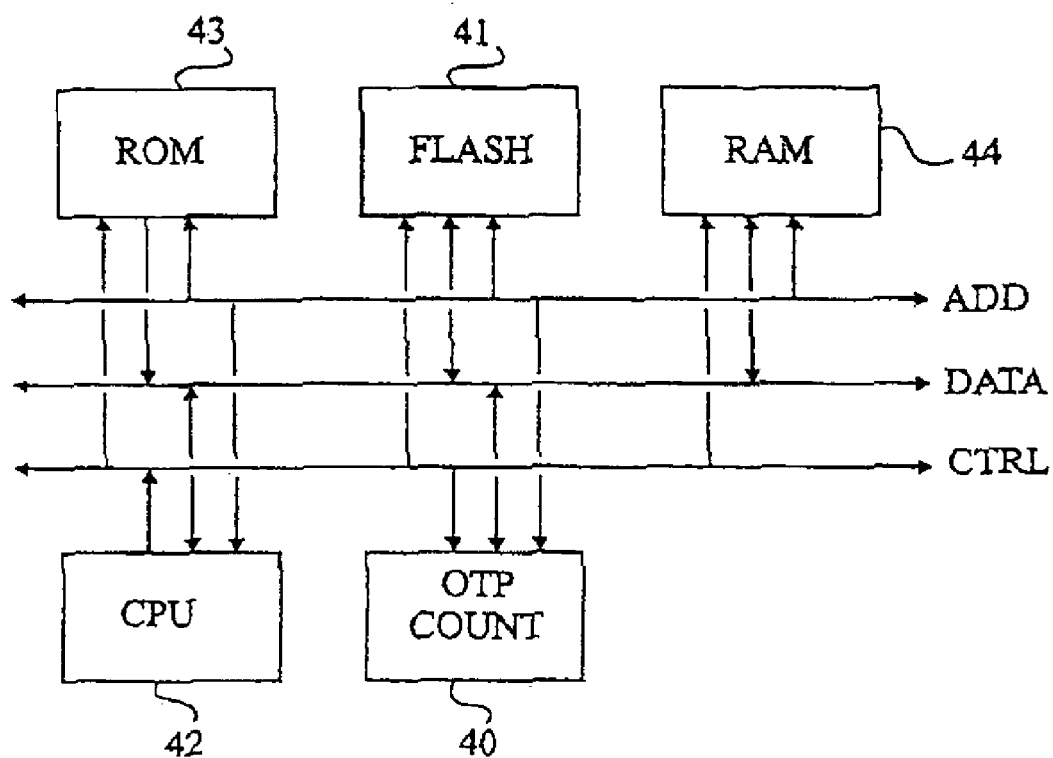
FIG. 7 illustrates an example of application of a counter of the present invention to a circuit using a flash memory.

FIG. 7 illustrates an example of application of a counter 40 according to the present invention in a circuit using a flash memory 41. In FIG. 7, only a CPU 42 has been shown, of which at least a portion of an operating program is stored in a ROM 43, at least some data of which are stored in a RAM 44, as well as three shared address, data, and control buses ADD, DATA, and CTRL.

The different elements 40 to 44 communicate together via the address, data, and control buses. In this example of application, counter 40 (OPT COUNT) of the present invention is used to irreversibly count down or count events, instead of what is conventionally done by a flash memory 41. A significant advantage then is that counting 40 is performed bit to bit, which requires a much smaller surface area than the programming of a flash memory in irreversible fashion.

Another advantage of the present invention is that, conversely to a programming of a flash memory which is reversible, the counter of the present invention introduces an irreversibility of the performed programming.

Of course, the present invention is likely to have various alterations, modifications, and improvements which will readily occur to those skilled in the art. In particular, the present invention applies whatever exploitation is made of the obtained count. Further, the dimensions to be given to the different resistors, transistors, and supply and read voltages are within the abilities of those skilled in the art based on the functional indications given hereabove and on the desired application. Further, the number of bits provided in the counter is not limited. Finally, other counting cell structures than those illustrated in FIGS. 3 to 5 may be envisaged, provided to respect the use of at least one resistive memorization polysilicon element, programmable by irreversible decrease in its value. One may in particular be inspired from a conventional memory cell structure, adapting it to the use of such a memorization element.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monotonic counter formed as an integrated circuit, each counting bit being provided by a memory cell containing at least one storage element formed of a polysilicon resistor, programmable by irreversible decrease in its resistance value;
    wherein the programming of said resistor is performed by temporarily submitting it to a constraint current greater than a current for which its resistance value exhibits a maximum, the maximum resistance value being greater than a nominal resistance value exhibited by the polysilicon resistor prior to submitting it to the constraint current.

2. The monotonic counter of claim 1, comprising a circuit for decoding the states contained in said cells for providing the resulting count.

3. The monotonic counter of claim 1, wherein each counting cell comprises, in parallel between two terminals of application of a supply voltage, two branches each comprising:
    a first polysilicon programming resistor connected between a first supply terminal and a terminal differential reading of the cell state; and
    at least one programming switch connecting one of said read terminals to the second supply terminal.

4. The monotonic counter of claim 3, wherein each branch comprises a programming switch.

5. The monotonic counter of claim 3, wherein said programming resistors are two polysilicon resistors identical in size and in possible doping.

6. The monotonic counter of claim 1, wherein each counting cell comprises a programming transistor in series with a programming resistor.

7. The monotonic counter of claim 1, further comprising a circuit for controlling the programming of each of the counting cells, capable of providing individual control signals to the programming switches.

8. A monotonic counter having a plurality of counting bits provided by a memory cell that includes at least one storage element comprising a resistor, programmable by decreasing the resistor's value;

wherein the programming of said resistor is performed by temporarily submitting the resistor to a programming current greater than a current for which the resistor's value exhibits a maximum, the maximum resistance value being greater than a nominal resistance value exhibited by the resistor prior to submitting the resistor to the programming current.

9. The monotonic counter of claim 8, comprising a circuit for decoding the states contained in said cells for providing the resulting count.

10. The monotonic counter of claim 9, wherein each counting cell comprises, in parallel between two terminals of application of a supply voltage, two branches each comprising:

a first polysilicon programming resistor connected between a first supply terminal and a terminal of differential reading of the cell state; and at least one programming switch connecting one of said read terminals to the second supply terminal.

11. The monotonic counter of claim 10, wherein each branch comprises a programming switch.

12. The monotonic counter of claim 10, wherein said programming resistors are two polysilicon resistors identical in size and in possible doping.

13. The monotonic counter of claim 8, wherein each counting cell comprises a programming transistor in series with a programming resistor.

14. The monotonic counter of claim 8, further comprising a circuit for controlling the programming of each of the counting cells, capable of providing individual control signals to the programming switches.

15. The monotonic counter of claim 8, wherein the decreasing includes irreversibly decreasing the value of the resistor.

16. The monotonic counter of claim 8, wherein the programming current is greater than about one milliamp.

17. A method of programming a monotonic counter having a resistor as a storage element, the method of comprising:

applying a programming current to the resistor such that a resistance value of the resistor is irreversibly decreased, thereby programming the monotomic counter;

wherein the programming current is greater than an current for which the resistance value exhibits a maximum resistance value, the maximum resistance value being greater than a nominal resistance value exhibited by the resistor prior to applying the programming current to the resistor.

18. The method of claim 17, wherein the programming current is greater than about one milliamp.

* * * * *

UNITED STATES PATENT AND TRADEMARK OFFICE
CERTIFICATE OF CORRECTION

PATENT NO. : 7,352,606 B2
APPLICATION NO. : 10/694165
DATED : April 1, 2008
INVENTOR(S) : Luc Wuidart It is certified that error appears in the above-identified patent and that said Letters Patent is hereby corrected as shown below:

On the Title Page, in the Abstract:

line 1 should read:
    A monotonic counter formed as an integrated circuit, each
line 3 should read:
    at least one memorization element formed of a polysilicon In Column 1, line 8 should read:
    more specifically, to monotonic counters with an irrevers-
line 11 should read:
    Currently, to form monotonic up-counters, fuse ele-
line 42 should read:
    which would be likely to be used in monotonic counting
line 48 should read:
    The present invention aims at providing a monotonic
line 57 should read:
    form a monotonic counter, the counting of which is com-
line 60 should read:
    of a monotonic counter by using conventional MOS-type
line 63 should read:
    provides a monotonic counter formed as an integrated
line 65 should read:
    containing at least one storage element formed of a Signed and Sealed this
Eighth Day of May, 2012

David J. Kappos
*Director of the United States Patent and Trademark Office*

CERTIFICATE OF CORRECTION (continued)
U.S. Pat. No. 7,352,606 B2

In Column 2, line 57 should read:
    The same elements have been designated with the same reference
line 65 should read:
    an irreversible monotonic counter is desired.
line 66 should read:
    A feature of the present invention is to form a monotonic In Column 3, line 2 should read:
    the storage element of each counting cell is formed of In Column 9, line 45 should read:
    forming a perfectly reliable monotonic counter, the pro-
line 55 should read:
    monotonic counter. It should however be noted that, In Column 10, line 22 should read:
    resistive storage polysilicon element, programmable In the Claims Col. 12, claim 17, line 19 should read:
    decreased, thereby programming the monotonic